(12) United States Patent
Ito et al.

(10) Patent No.: US 7,057,944 B2
(45) Date of Patent: Jun. 6, 2006

(54) SEMICONDUCTOR READOUT CIRCUIT

(75) Inventors: Nobuhiko Ito, Tenri (JP); Kaoru Yamamoto, Yamatokohriyama (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/013,119

(22) Filed: Dec. 14, 2004

(65) Prior Publication Data

US 2005/0135161 A1    Jun. 23, 2005

(30) Foreign Application Priority Data

Dec. 17, 2003   (JP) .............................. 2003-419757

(51) Int. Cl.
*G11C 7/06* (2006.01)
(52) U.S. Cl. ................. 365/189.07; 365/202; 365/203; 365/189.01
(58) Field of Classification Search ........... 365/189.07, 365/202, 203, 207, 189.01
See application file for complete search history.

(56) References Cited

U.S. PATENT DOCUMENTS

| | | | |
|---|---|---|---|
| 5,068,831 A | 11/1991 | Hoshi et al. | |
| 5,434,821 A | 7/1995 | Watanabe et al. | |
| 5,544,114 A * | 8/1996 | Gaultier et al. | 365/202 |
| 6,392,943 B1 * | 5/2002 | Fournel | 365/207 |
| 6,822,907 B1 * | 11/2004 | Maruyama et al. | 365/185.21 |
| 2002/0075731 A1 * | 6/2002 | Amano | 365/196 |
| 2003/0058720 A1 * | 3/2003 | Park | 365/203 |

FOREIGN PATENT DOCUMENTS

| | | |
|---|---|---|
| EP | 0 470 719 A2 | 2/1992 |
| EP | 0 470 719 A3 | 2/1992 |
| JP | 10-11974 | 1/1998 |

OTHER PUBLICATIONS

European Search Report mailed on Apr. 25, 2005 for EP application No. 04 25 7744, 2 pages.

* cited by examiner

*Primary Examiner*—Tuan T. Nguyen
*Assistant Examiner*—Toan Le
(74) *Attorney, Agent, or Firm*—Morrison & Foerster LLP

(57) ABSTRACT

A semiconductor readout circuit reads out a potential of each of plural data lines by comparing the potential with a potential of a common reference data line, using a sense amplifier provided for each of the data lines. This semiconductor readout circuit has a current control circuit provided for each of the data lines. The current control circuit controls the potential of the corresponding one of the data lines so that a potential difference between the potential of the corresponding data line and the potential of the reference data line can be reduced based on an output as to the potential difference detected by the sense amplifier.

6 Claims, 8 Drawing Sheets

SEMICONDUCTOR READOUT CIRCUIT

CROSS REFERENCE TO RELATED APPLICATIONS

This Nonprovisional application claims priority under 35 U.S.C. § 119 (a) on Patent Application No. 2003-419757 filed in Japan on 17 Dec. 2003, the entire contents of which are hereby incorporated by reference.

BACKGROUND OF THE INVENTION

1. Field of the Invention

The present invention relates to a data readout circuit for semiconductor devices.

2. Description of the Related Art

JP-A 10-11974 (1998) discloses a circuit that amplifies data accumulated in a memory cell in a semiconductor device before reading the data out (see FIG. 7). In this circuit structure, drivers that have higher ability than the current driving ability of the pull-ups and the memory cells of data lines DL and DLB are provided for the respective data lines DL and DLB. With the drivers, the potentials of the data lines DL and DLB become equal to one another in the initial stage of a data readout operation (i.e., during the process of equalizing the data lines), and all the potentials are also stabilized at a predetermined level. The potentials of the data lines DL and DLB are set at a slightly lower level than normal, so that it becomes easier to saturate an N-type MOSFET, and the gain of the sense amplifier can be increased. In short, during the process of equalizing the data lines at the time of a data readout operation, the data line potentials are set at a predetermined level, and the operation speed of the sense amplifier can be increased.

However, there are the following problems with the above conventional data readout method.

A general memory device, such as a DRAM, a SRAM, or a flash memory, is designed to read out plural sets of data at the same time. To read out data from plural memory cells at the same time, a signal that serves as a reference with respect to the data to be read out from each of the memory cells is required. In the conventional structure shown in FIG. 7, the signal on the data lines DLB serves as a reference signal, with the signal on the data line DL representing the data read out from a memory cell. In this structure, it is necessary to prepare the same number of circuits for generating reference signals as the number of sets of data to be read out. This leads to an increase in chip area. To avoid the problem, a reference signal generating circuit may be shared among plural readout circuits. In the conventional circuit structure, however, the data lines DL from which data are to be read out at the same time are short-circuited to the reference line DLB in the initial stage of a data readout operation (i.e., during the process of equalizing the data lines). If a problem is caused in one of the data lines during the process in such a structure, the voltages at all the data lines DL become unstable, and the data cannot be properly read out from the other normal data lines, because all the other normal data lines DL from which data are to be read out at the same time are connected to the data line DL having the problem via the data line DLB serving as the reference data line.

SUMMARY OF THE INVENTION

The present invention has been made in view of the above disadvantages, and it is therefore an object of the present invention to provide a semiconductor readout circuit in which the operation of reading out data from any normal data line is not adversely affected by a problem caused in a data line in a circuit structure that utilizes a reference potential when reading out data from the data lines.

According to the first feature of the present invention, a semiconductor readout circuit reads out the potential of each of a plurality of data lines by comparing the potential with the potential of a common reference data line, using a sense amplifier provided for each of the data lines. The semiconductor readout circuit comprises a control circuit that detects the potential difference between the potential of a corresponding one of the data lines and the potential of the reference data line prior to the readout operation using the sense amplifier, and then controls the potential of the corresponding data line so as to reduce the potential difference. The control circuit is provided for each of the data lines.

According to the semiconductor readout circuit with the first feature of the present invention, the potential of each of the data lines is made equal to the potential of the reference data line not by a transistor or the like short-circuiting each of the data lines and the reference data line, but by the control circuit controlling the potential of each corresponding data line to become equal to the potential of the reference data line, based on the detected potential difference between each corresponding data line and the reference data line. As a result, the data lines are indirectly equalized to the reference data line independently of one another. Accordingly, even when a problem is caused in one of the data lines, the other data lines can be properly equalized to the reference data line. Thus, a normal readout operation can be performed, without any adverse influence of the problem caused in one of the data lines.

According to the second feature of the present invention, in the above semiconductor readout circuit, the control circuit includes: a potential difference detecting circuit that detects the potential difference between the potential of the corresponding data line and the potential of the reference data line; and a current control circuit that controls the amount of current flowing between the corresponding data line and a fixed potential line for supplying a predetermined fixed potential, based on an output voltage at the corresponding potential difference detecting circuit. Here, the fixed potential line is a line other than the reference data line. According to the semiconductor readout circuit with the second feature, the amount of current flowing between each of the data lines and the fixed potential line is controlled based on the output voltage generated by detecting the potential difference between each of the data lines and the reference data line. Accordingly, the amount of current can be controlled so that the potential of each of the data line becomes equal to the potential of the reference data line. Thus, a control circuit with the first feature can be realized, and the effects of the semiconductor readout circuit with the first feature can be achieved.

More preferably, in the semiconductor readout circuit with the second feature, the potential difference detecting circuit is also the sense amplifier. With such a structure, it is not necessary to employ a potential difference detecting circuit separately from a sense amplifier. Thus, a simpler circuit structure can be realized, and the area of the circuit structure can be reduced.

More specifically, in the semiconductor readout circuit with the second feature, the potential difference detecting circuit is designed to reduce the output voltage when the potential of the corresponding data line is higher than the potential of the reference data line. Also, in the semiconductor readout circuit with the second feature, the fixed potential is a ground potential, and the current control circuit includes a P-type MOSFET that receives the output of the potential difference detecting circuit as a gate input. When the potential of the corresponding data line is higher than the potential of the reference data line in this structure, the output voltage at the potential difference detecting circuit decreases. As a result of this, the amount of current flowing in the P-type MOSFET of the current control circuit increases, and the potential of the corresponding data line decreases and approaches the ground potential. On the other hand, when the potential of the corresponding data line is lower than the potential of the reference data line, the output voltage at the potential difference detecting circuit increases. As a result of this, the amount of current flowing in the P-type MOSFET of the current control circuit decreases, and the potential of the corresponding data line is prevented from decreasing. Therefore, the current control circuit functions to make the potential of the corresponding data line substantially equal to the potential of the reference data line. Accordingly, the corresponding data line is indirectly equalized to the reference data line, and the effects of the semiconductor readout circuit with the first feature can be achieved.

Also in the semiconductor readout circuit with the second feature, the potential difference detecting circuit is designed to increase the output voltage when the potential of the corresponding data line is higher than the potential of the reference data line. Further, the fixed potential is a ground potential, and the current control circuit includes an N-type MOSFET that receives the output of the potential difference detecting circuit as a gate input and is located between the corresponding data line and the fixed potential line. When the potential of the corresponding data line is higher than the potential of the reference data line in this structure, the output voltage at the potential difference detecting circuit increases. As a result of this, the amount of current flowing in the N-type MOSFET of the current control circuit increases, and the potential of the corresponding data line decreases and approaches the ground potential. On the other hand, when the potential of the corresponding data line is lower than the potential of the reference data line, the output voltage at the potential difference detecting circuit decreases. As a result of this, the amount of current flowing in the N-type MOSFET of the current control circuit decreases, and the potential of the corresponding data line is prevented from decreasing. Therefore, the current control circuit functions to make the potential of the corresponding data line substantially equal to the potential of the reference data line. Accordingly, the corresponding data line is indirectly equalized to the reference data line, and the effects of the semiconductor readout circuit with the first feature can be achieved.

Also in the semiconductor readout circuit with the second feature, the potential difference detecting circuit is designed to reduce the output voltage when the potential of the corresponding data line is higher than the potential of the reference data line. Further, the fixed potential is a source potential, and the current control circuit includes an N-type MOSFET that receives the output of the potential difference detecting circuit as a gate input and is located between the corresponding data line and the fixed potential line. When the potential of the corresponding data line is lower than the potential of the reference data line in this structure, the output voltage at the potential difference detecting circuit increases. As a result of this, the amount of current flowing in the N-type MOSFET of the current control circuit increases, and the potential of the corresponding data line increases and approaches the source potential. On the other hand, when the potential of the corresponding data line is higher than the potential of the reference data line, the output voltage at the potential difference detecting circuit decreases. As a result of this, the amount of current flowing in the N-type MOSFET of the current control circuit decreases, and the potential of the corresponding data line is prevented from increasing. Therefore, the current control circuit functions to make the potential of the corresponding data line substantially equal to the potential of the reference data line. Accordingly, the corresponding data line is indirectly equalized to the reference data line, and the effects of the semiconductor readout circuit with the first feature can be achieved.

Also in the semiconductor readout circuit with the second feature, the potential difference detecting circuit is designed to increase the output voltage when the potential of the corresponding data line is higher than the potential of the reference data line. Further, the fixed potential is a source potential, and the current control circuit includes a P-type MOSFET that receives the output of the potential difference detecting circuit as a gate input and is located between the corresponding data line and the fixed potential line. When the potential of the corresponding data line is lower than the potential of the reference data line in this structure, the output voltage at the potential difference detecting circuit decreases. As a result of this, the amount of current flowing in the P-type MOSFET of the current control circuit increases, and the potential of the corresponding data line increases and approaches the source potential. On the other hand, when the potential of the corresponding data line is higher than the potential of the reference data line, the output voltage at the potential difference detecting circuit increases. As a result of this, the amount of current flowing in the P-type MOSFET of the current control circuit decreases, and the potential of the corresponding data line is prevented from increasing. Therefore, the current control circuit functions to make the potential of the corresponding data line substantially equal to the potential of the reference data line. Accordingly, the corresponding data line is indirectly equalized to the reference data line, and the effects of the semiconductor readout circuit with the first feature can be achieved.

In order to achieve the above objects, the present invention also provides a semiconductor readout circuit that reads out the potential of each of a plurality of data lines by comparing the potential with the potential of a common reference data line, using a sense amplifier provided for each of the data lines. The semiconductor readout circuit comprises a control circuit that short-circuits the corresponding one of the data lines and the output of the sense amplifier prior to the readout operation using the sense amplifier, and then controls the potential of the corresponding data line so as to reduce the potential difference between the potential of the corresponding data line and the potential of the reference data line. Herein, the control circuit is provided for each of the data lines.

According to this semiconductor readout circuit of the present invention, the potential of each of the data lines is made equal to the potential of the reference data line not by a transistor or the like short-circuiting each of the data lines and the reference data line, but by the control circuit short-circuiting each of the data lines and the output of each corresponding sense amplifier. As a result, the data lines are indirectly equalized to the reference data line independently of one another. Accordingly, even when a problem is caused in one of the data lines, the other data lines can be properly equalized to the reference data line. Thus, a normal readout operation can be performed, without any adverse influence of the problem caused in one of the data lines.

DETAILED DESCRIPTION OF THE PREFERRED EMBODIMENTS

The following is a description of a semiconductor readout circuit as embodiments of the present invention (hereinafter, appropriately referred to as "inventive circuit"), with reference to the accompanying drawings.

First Embodiment

Figure 1:
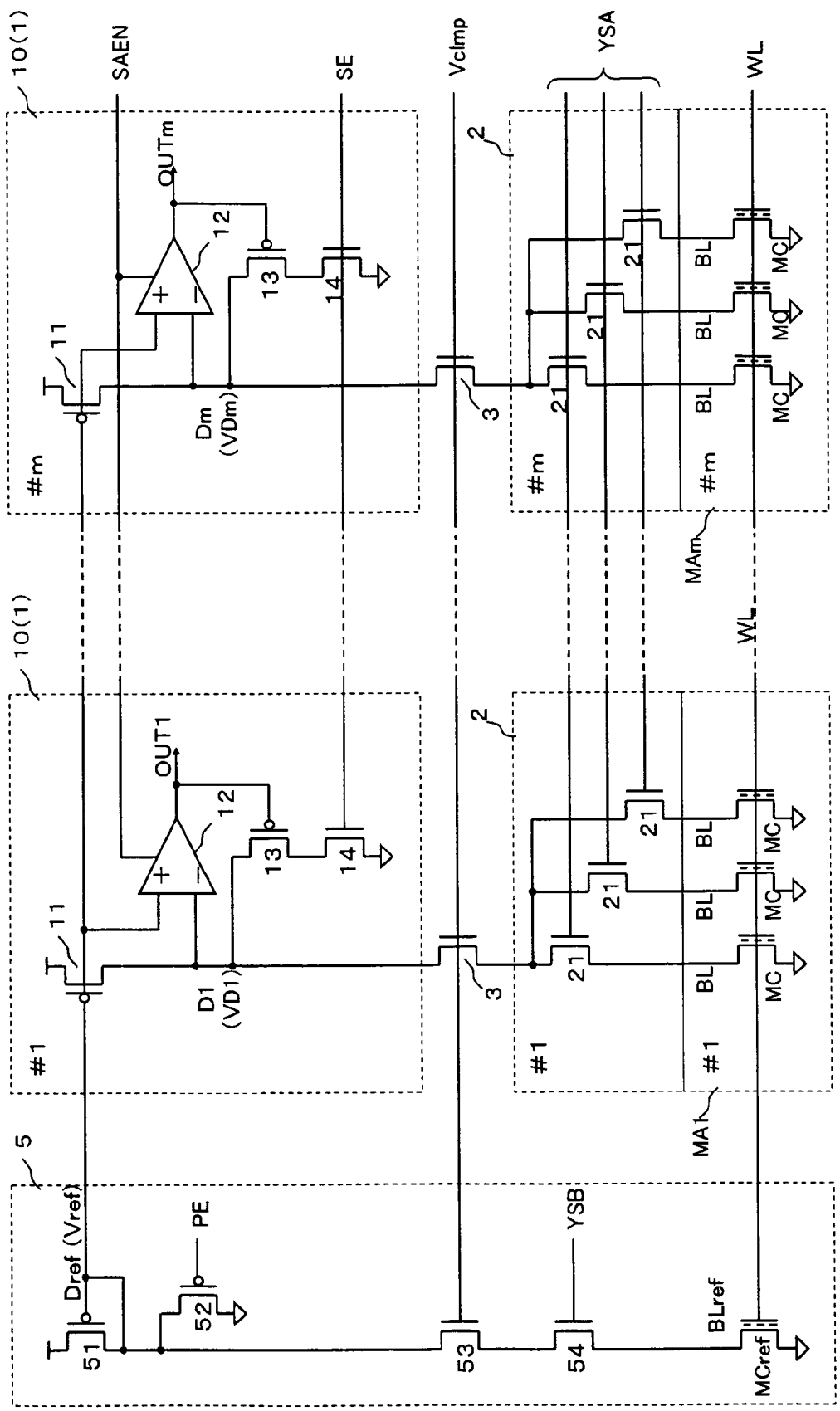
FIG. 1 is a circuit diagram illustrating the circuit structure of a first embodiment of a semiconductor readout circuit according to the present invention.

FIG. 1 is a circuit diagram illustrating the structure of the inventive circuit 10. In this embodiment, a semiconductor device that includes plural memory arrays MA1 through MAm is used. In each of the memory arrays MA1 through MAm, a memory cell MC is selected according to an address signal that is input to the semiconductor device from the outside or is generated inside the semiconductor device. The data stored in the selected memory cells appear as a minute potential change on data lines D1 through Dm that are provided for the respective memory arrays MA1 through MAm. The potential of each of the data lines D1 through Dm is compared with the potential of a common reference data line Dref, and the potential difference is amplified. One set of data are then read out from each of the memory arrays MA1 through MAm.

This embodiment is described on the assumption that the inventive circuit 1 is a flash-memory readout circuit. Therefore, flash memory cells of a floating gate type are employed as memory cells in this embodiment, though the memory cells MC are not particularly limited to flash memory cells. The memory arrays MA1 through MAm are aligned as arrays in the row direction and the column direction. In general, the control gates of the memory cells in the same row are driven on the same word line, and the drain electrodes of the memory cells in the same column are connected to the same bit line. In the example shown in FIG. 1, each of the memory arrays MA1 through MAm is a 1×3 structure having one word line WL and three bit lines BL for the purpose of simplifying its description.

The inventive circuit 1 has readout circuit units 10 of the same circuit structures (hereinafter, referred to as the inventive circuits 10) provided in the respective memory arrays MA1 through MAm. The data line Di (i=1 to m) of each of the inventive circuits 10 and the bit lines BL of the corresponding memory array MAi (i=1 to m) are connected via a column selecting circuit 2 and an N-type MOSFET (hereinafter, referred to simply as "NMOS") 3. The inventive circuits 10, the column selecting circuits 2, and the NMOSs 3 are provided for the respective memory arrays MA1 through MAm, and the memory arrays MA1 through MAm have the same structure. The potential Vref of the reference data line Dref is generated from a reference potential generating circuit 5, and is then supplied to each of the inventive circuits 10. The potential Vref is hereinafter referred to as the reference potential.

In the following, the structure of each component is described in detail.

Each of the inventive circuits 10 includes: a P-type MOSFET (hereinafter, referred to as "PMOS") 11 that has a gate connected to the reference data line Dref, a source connected to a power supply line, and a drain connected to the data line Di (i=1 to m); a sense amplifier 12 of a differential amplifying type that has the reference data line Dref and the data line Di as differential inputs; a PMOS 13 that has a gate connected to the output OUTi (i=1 to m) of the sense amplifier 12, and a source connected to the data line Di; and an NMOS 14 that has a gate connected to an equalizing signal SE, a source connected to a ground line, and a drain connected to the drain of the PMOS 13.

Figure 6:
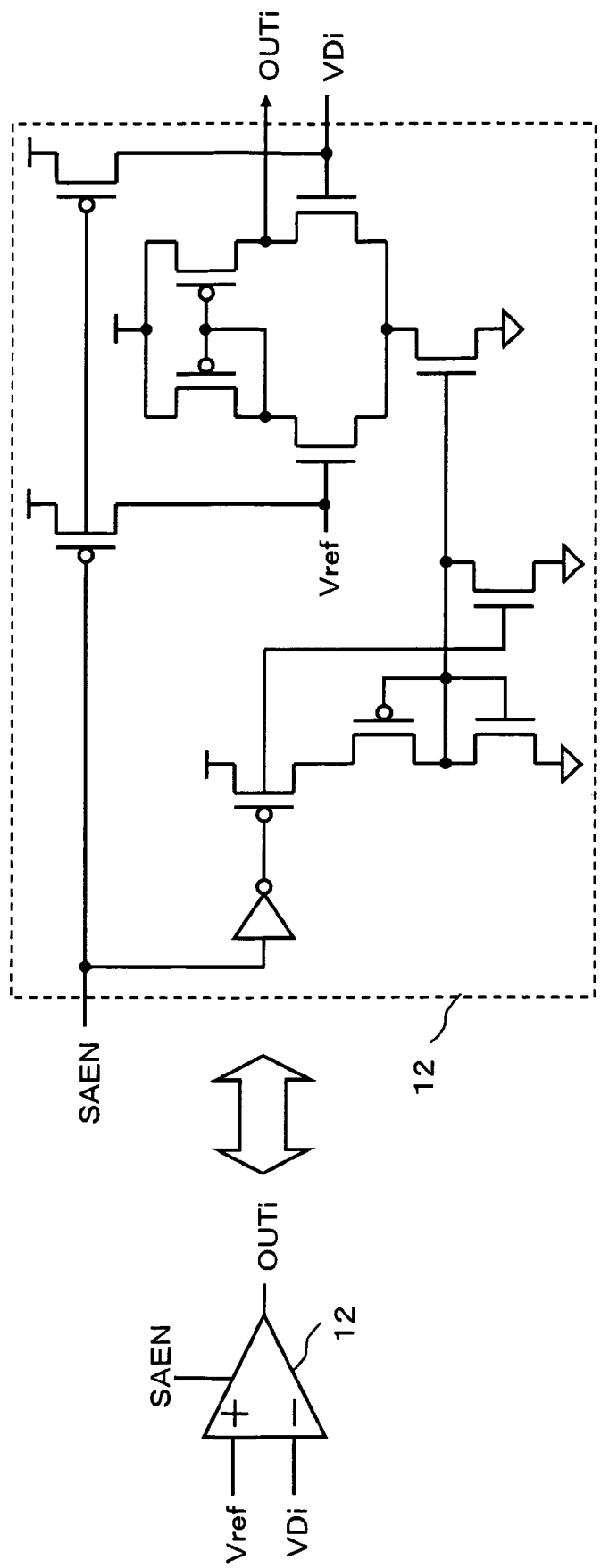
FIG. 6 is a circuit diagram illustrating an example of the circuit structure of a sense amplifier.
Figure 7:
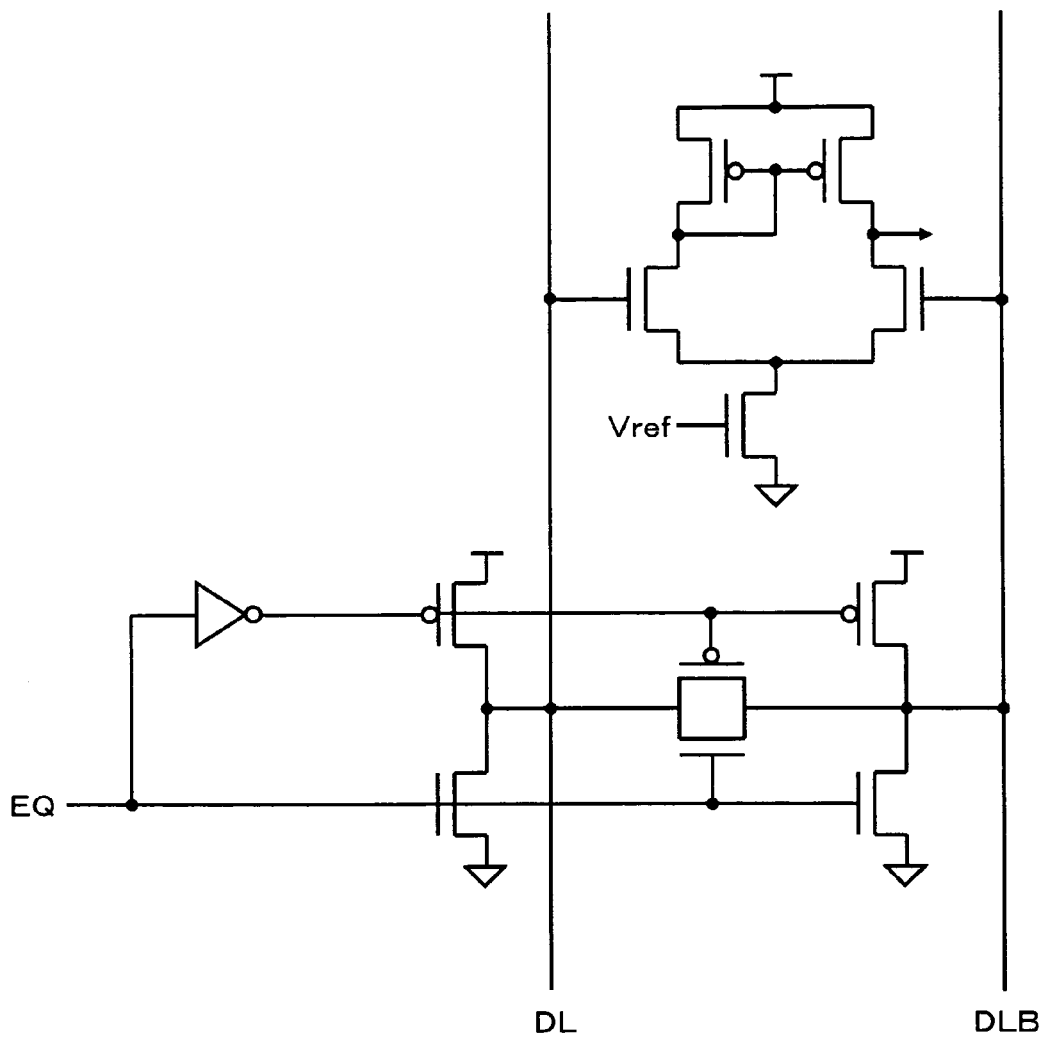
FIG. 7 is a circuit diagram illustrating an example of the circuit structure of a conventional semiconductor readout circuit.

Each sense amplifier 12 of this embodiment is activated when a control signal SAEN is at "H" (high) level. For example, a known circuit structure shown in FIG. 6 is used as the sense amplifier 12. However, the sense amplifier 12 is not limited to the circuit structure shown in FIG. 6, as long as it is of a differential input type. In this embodiment, when data are to be read out, the sense amplifier 12 compares a change in the potential of the data line Di corresponding to the data stored in the selected memory cell with the reference potential Vref, and the potential change is amplified. The amplified potential change is read out from the output OUTi and is output as readout data. The sense amplifier 12 also functions as a potential difference detecting circuit that is part of a control circuit with an equalizing function characteristic of the present invention, and detects the potential difference between the potential VDi of the corresponding data line Di and the reference potential Vref during the equalizing period.

Each series circuit, that is formed by the corresponding PMOS 13 and the corresponding NMOS 14 interposed between the corresponding data line Di and the ground line, functions as a current control circuit that controls the amount of current flowing from the data line Di to the ground line, according to the potential of the output OUTi that is the output as to the detected potential difference between the potential VDi of the data line Di and the reference potential Vref. Also, each of the series circuits is controlled by the equalizing signal SE, and has a current path formed and is set to an equalizing operation mode when the equalizing signal SE is at "H" level.

The reference potential generating circuit 5 includes: a PMOS 51 that has a gate and a drain connected to the reference data line Dref, and a source connected to a power supply line; a PMOS 52 that has a gate connected to a control signal PE, a source connected to the reference data line Dref, and a drain connected to a ground line; an NMOS 53 that has a gate connected to a predetermined intermediate potential Vclmp, and a drain connected to the reference data line Dref; an NMOS 44 that has a gate connected to a reference column selecting signal YSB, a source connected to a reference bit line BLref, and a drain connected to the source of the NMOS 53; and a reference cell MCref that has a control gate connected to a word line WL, a source connected to the ground line, and a drain connected to the reference bit line BLref.

The PMOS 51 of the reference potential generating circuit 5 and the PMOS 11 of each inventive circuit 10 has a current mirror structure. Since the current flowing in the PMOS 51 is equal to the current flowing in the reference cell MCref, the PMOS 51 supplies a current substantially equal to the current flowing in the reference cell MCref The PMOS 52 is turned on when the control signal PE switches to "L" (low) level at the initial stage of the readout operation, and then sets the reference potential Vref in the initial state. The NMOS 54 is equivalent to the NMOSs 21 of each column selecting circuit 2, and the NMOS 53 is equivalent to each NMOS 3. Any two components equivalent to each other have the same characteristics (such as the gate width and the gate length). The reference cell MCref has the same structure as the memory cells MC of the memory arrays MA1 through MAm. However, the threshold voltage is set at the same value as the predetermined value of the reference cell MCref, and the reference potential Vref is adjusted according to the set value. In this embodiment, the word line WL of the memory arrays MA1 through MAm is connected to the control gate of the reference cell MCref. However, it is also possible to separately form a word line especially for the reference cell MCref. The reference potential generating circuit 5 shown in FIG. 1 is merely an example, and is not limited to the shown structure as long as the predetermined reference potential Vref can be output.

Each column selecting circuit 2 selects one bit line BL from the bit lines BL (only three of the bit lines BL are shown in FIG. 1) of the memory array MAi (i=1 to m), and relays the cell current of the memory cell MC, which is selected through the word line WL, to the data line Di via the selected bit line BL. The column selecting circuit 2 includes the same number of column selecting NMOSs 21 as the number of bit lines BL of each memory array MAi. The gates of the NMOSs 21 are connected to column selecting signals YSA that are generated by decoding the address signal and are different from one another. The source of each NMOS 21 is connected to each corresponding bit line BL, and the drain of each NMOS 21 is connected to the source of each corresponding NMOS 3.

Each gate of the NMOSs 3 and the NMOS 53 of the reference potential generating circuit 5 is supplied with the predetermined intermediate potential Vclmp, so that the potential of the bit line BL on the side of each source and the potential of the reference bit line BLref are maintained at a constant potential, regardless of the potential VDi of the data line Di on the side of each drain and the reference potential Vref. Also, with the predetermined intermediate potential Vclmp being supplied to each gate of the NMOSs 3 and the NMOS 53, the cell current in each memory cell MC is transmitted to each corresponding data line Di, and the cell current in the reference cell MCref is transmitted to the reference data line Dref.

Figure 2:
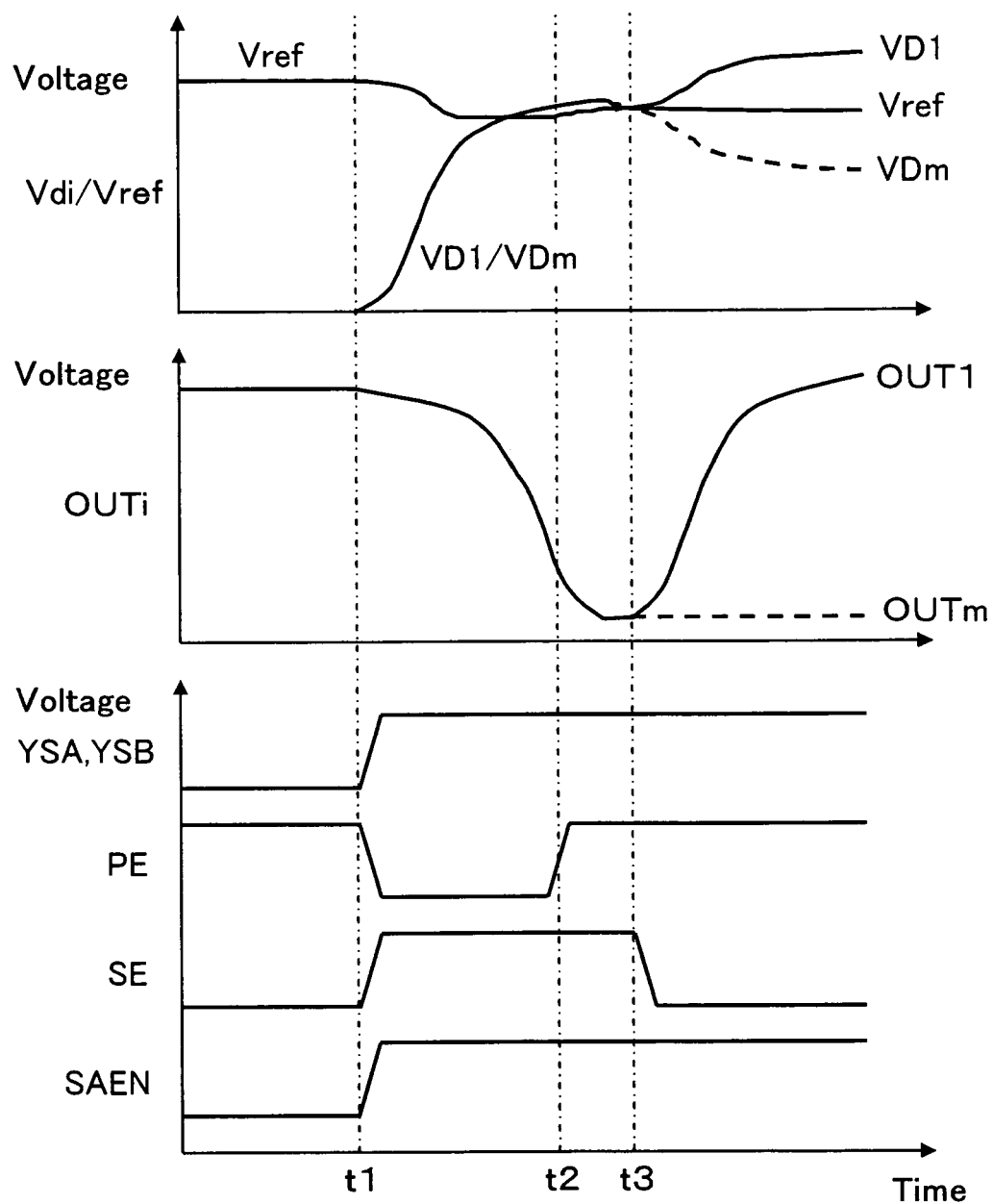
FIG. 2 is a timing chart showing the data readout operation in the first embodiment of the semiconductor readout circuit according to the present invention.

Next, the operations of the inventive circuit 1 and a peripheral circuit such as the reference potential generating circuit 5 are sequentially described, with reference to the timing charts shown in FIG. 2.

When an access signal is input (or generated), the column selecting signals YSA and YSB are placed into an enable state, according to an address signal that is input together with the access signal (time t1). At the same time, the reference data line Dref is discharged to such a predetermined voltage as to turn on the PMOS 11 and the PMOS 51, and therefore, the control signal PE is set at "L" level (the ground potential, for example). By doing so, the PMOS 11 and the PMOS 51 are turned on, and precharging of the data line Di and the bit lines BL is started. At the same time, the control signal SAEN is set at "H" level so as to activate the sense amplifier 12, and the potential difference between the reference potential Vref and the potential VDi of the data line Di starts to be detected (time t1). Here, the equalizing signal SE is also set at "H" level (time t1). If the potential VDi of the data line Di becomes higher than the reference potential Vref through the precharging, the output OUTi of the sense amplifier 12 switches to "L" level, and the PMOS 13 is turned on. Also, the data line Di is discharged toward the ground potential via the series circuit formed by the PMOS 13 and the NMOS 14. If the potential VDi of the data line Di becomes equal to the reference potential Vref through the discharging, the sense amplifier 12 detects the situation, and the output OUTi becomes the intermediate potential so as to turn off the PMOS 13. Through this process, the reference potential Vref and the potential VDi of the data line Di can be indirectly equalized to each other. Here, to equalize the potentials, the reference data line Dref and the data line Di are not short-circuited to each other with a switching element such as a MOSFET. Accordingly, even in a case where a bit line BL and the ground line are short-circuited due to a problem caused in the memory cell MC from which data are to be read out, the reference potential Vref is not affected by the short-circuiting. Thus, readout from any memory array not having a problem caused therein can be properly performed.

The control signal PE is then returned to "H" level, so that the precharging is ended (time t2). The equalizing signal SE is next returned to "L" level (time t3). As a result, the equalizing operation being performed via the series circuit formed by the PMOS 13 and the NMOS 14 is stopped, and the potential VDi of the data line Di quickly shifts to a voltage that is determined by the relationship between the amount of current supplied from the memory cell MC and the amount of current supplied from the PMOS 11 (which is substantially equal to the cell current flowing in the reference cell MCref). Here, the PMOS 11 supplies the current that is generated by mirroring the cell current in the reference cell MCref (i.e., the current substantially equal to the current flowing in the reference cell MCref), as described earlier. If the amount of current flowing in the memory cell MC is greater than the amount of current flowing in the reference cell MCref, the potential VDi of the data line Di quickly decreases (see the waveform of VDm indicated by a broken line in FIG. 2). If the amount of current flowing in the memory cell MC is smaller than the amount of current flowing in the reference cell MCref, the potential VDi of the data line Di quickly increases (see the waveform of VD 1 indicated by a solid line in FIG. 2). Accordingly, the sense amplifier 12 compares a change in the potential VDi of the data line Di with the reference potential Vref, and the potential change is amplified, then outputs the amplified change as readout data from the output OUTi at high speed.

Next, other embodiments (second through fourth embodiments) of the inventive circuit 1 are described.

Second Embodiment

Figure 3:
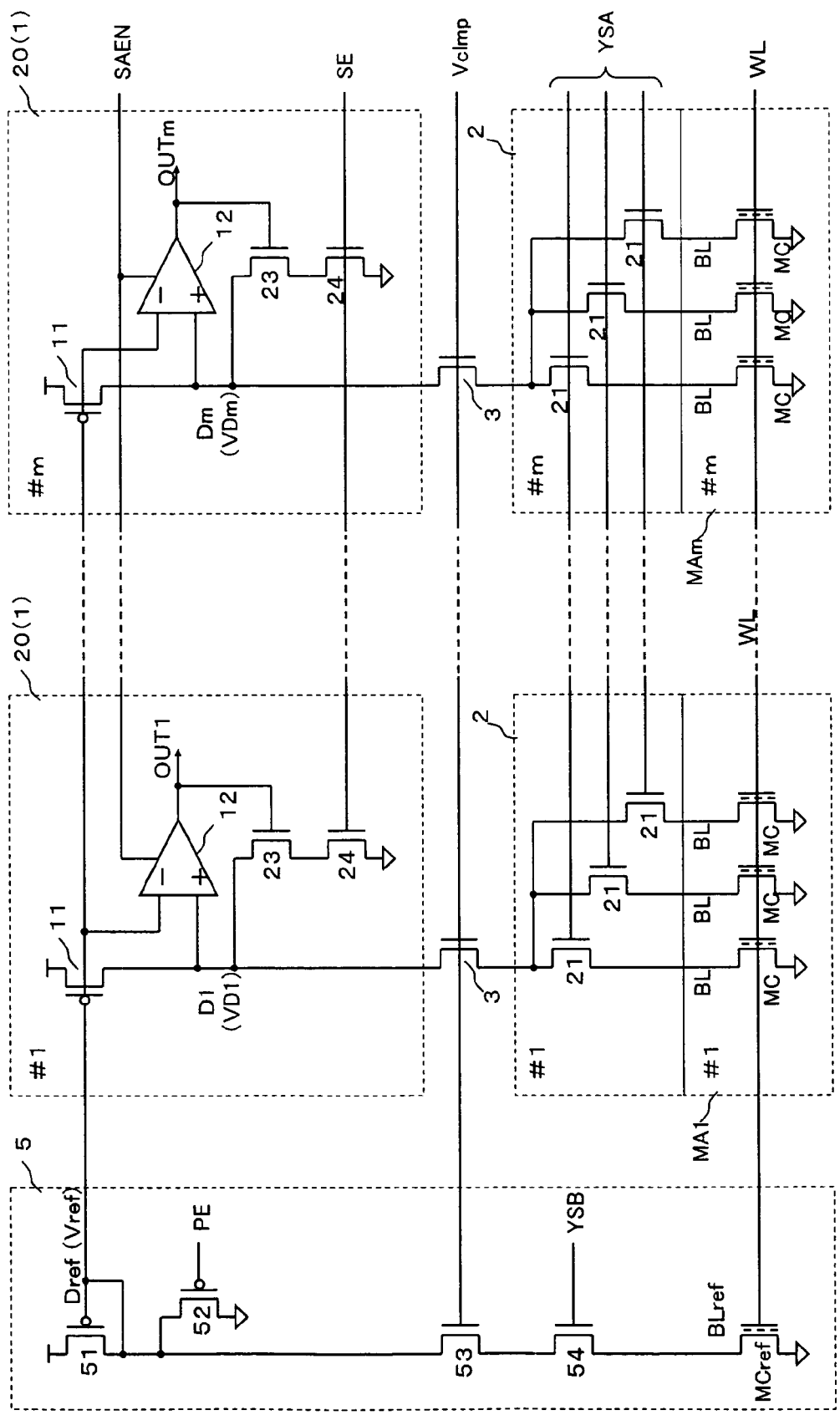
FIG. 3 is a circuit diagram illustrating the circuit structure of a second embodiment of the semiconductor readout circuit according to the present invention.

In each inventive circuit 10 of the first embodiment 1, a series circuit formed by the PMOS 13 and the NMOS 14 is interposed between the data line Di and the ground line to form a current control circuit that controls the amount of current flowing from the data line Di to the ground line, according to the potential of the output OUTi that is the output as to the detected potential difference between the potential VDi of the data line Di and the reference potential Vref. In each inventive circuit 20 of the second embodiment, on the other hand, the PMOS 13 is replaced with an NMOS 23, so that the polarities of the differential inputs to the sense amplifier 12 are reversed as shown in FIG. 3. Thus, the same equalizing function as that of the first embodiment can be obtained. The other components and aspects of each inventive circuit 20 of the second embodiment are the same as those of the first embodiment, and therefore, explanation of them is omitted herein.

Third Embodiment

Figure 4:
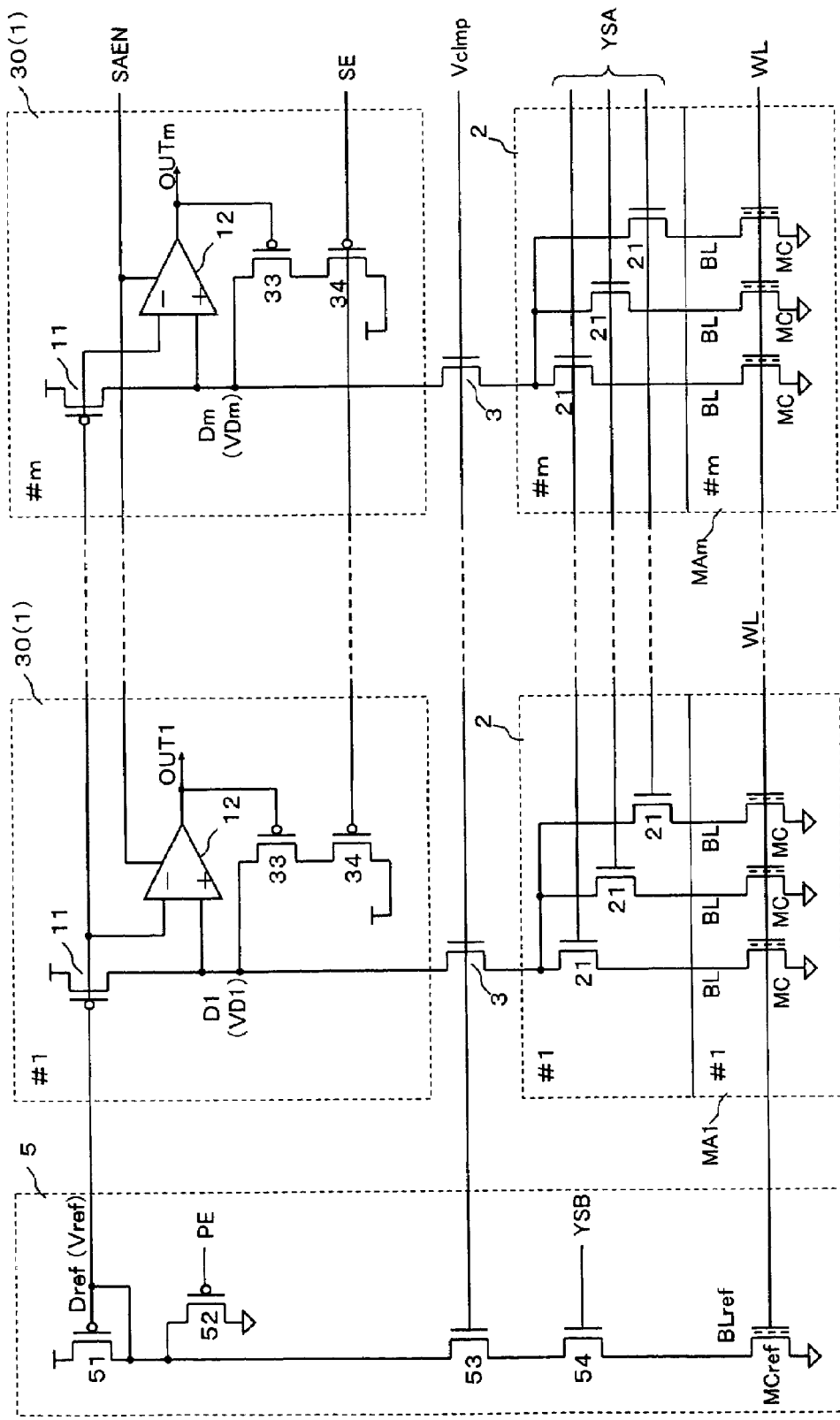
FIG. 4 is a circuit diagram illustrating the circuit structure of a third embodiment of the semiconductor readout circuit according to the present invention.

If the precharging of the bit lines BL takes a long period of time due to an adverse influence of parasitic capacitance or the like, the precharging of the data line Di also takes a long period of time. Therefore, the current for equalizing the data line Di to the reference data line Dref is also used as the current for precharging the data line Di. More specifically, the current control circuit is formed between the data line Di and the power supply line, so as to shorten the precharging time. Accordingly, in each inventive circuit 30 of the third embodiment, a series circuit formed by a PMOS 33 and a PMOS 34 is interposed between the data line Di and the power supply line as shown in FIG. 4. Also, the gate of the PMOS 33 is connected to the output OUTi of the sense amplifier 12, the source of the PMOS 33 is connected to the drain of the PMOS 34, the drain of the PMOS 33 is connected to the data line Di, the gate of the PMOS 34 is connected to the equalizing signal SE, the source of the PMOS 34 is connected to the power supply line, and the drain of the PMOS 34 is connected to the source of the PMOS 33. In this manner, the current control circuit is formed. In this structure, the polarities of the differential inputs to the sense amplifier 12 are reversed, as in the second embodiment.

Fourth Embodiment

Figure 5:
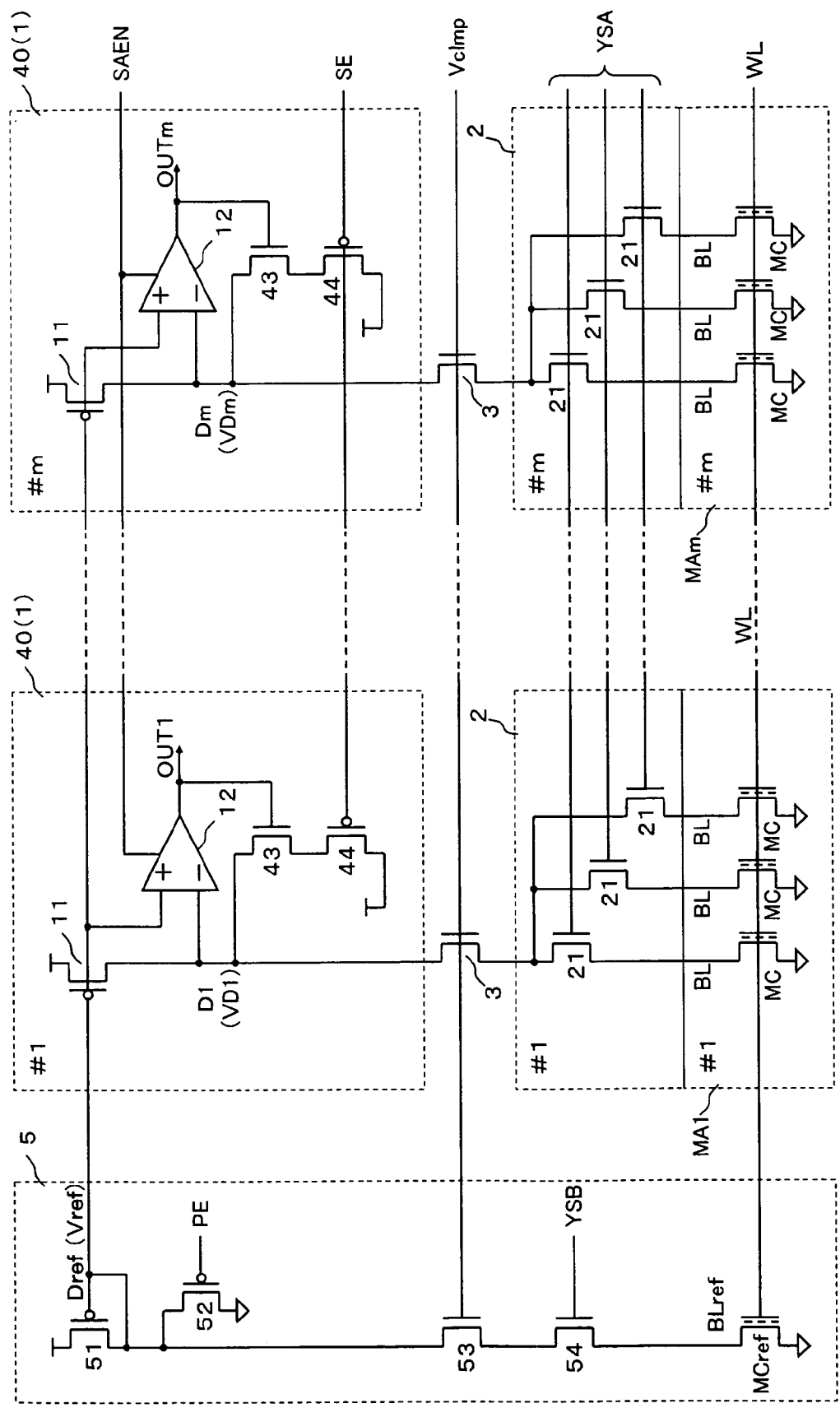
FIG. 5 is a circuit diagram illustrating the circuit structure of a fourth embodiment of the semiconductor readout circuit according to the present invention.

In each inventive circuit 30 of the third embodiment, a series circuit formed by the PMOS 33 and the PMOS 34 is interposed between the data line Di and the power supply line, so as to form a current control circuit that controls the amount of current flowing from the power supply line to the data line Di, according to the potential of the output OUTi that is the output as to the detected potential difference between the potential VDi of the data line Di and the reference potential Vref. In each inventive circuit 40 of the fourth embodiment, on the other hand, the PMOS 33 is replaced with an NMOS 43, and the polarities of the differential inputs to the sense amplifier 12 are reversed (to exhibit the same polarities as those in the first embodiment) as shown in FIG. 5. Thus, the same precharging and equalizing functions as those of the third embodiment can be achieved.

Each of the above embodiments has been described on the assumption that the source potential is a higher positive potential than the ground potential. If the source potential is a negative potential, a suitable modification can be made to each circuit, without departing from the scope of the present invention. For example, the polarities of each MOSFET may be reversed.

Fifth Embodiment

Figure 8:
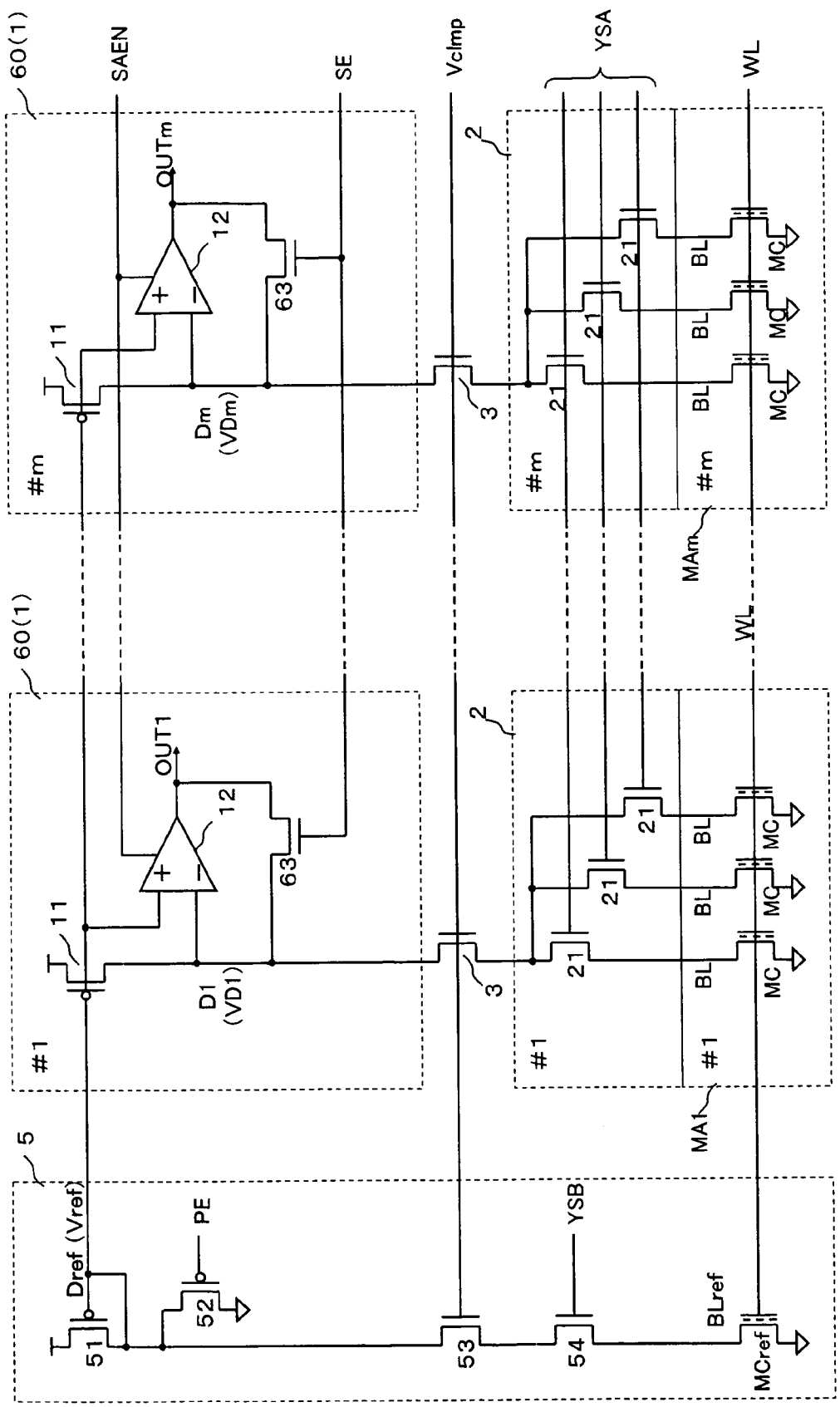
FIG. 8 is a circuit diagram illustrating the circuit structure of a fifth embodiment of the semiconductor readout circuit according to the present invention.

FIG. 8 illustrates the circuit structures of inventive circuits 50 of the fifth embodiment. In each of the inventive circuits 10 through 40 of the first through fourth embodiments, a series circuit formed by a PMOS and a NMOS or two PMOSs or two NMOSs is interposed between each corresponding data line Di and the ground line or the power supply line, so as to form a control circuit for reducing the potential difference between the potential VDi of the corresponding data line Di and the reference potential Vref. In each inventive circuit 50 of the fifth embodiment, however, an NMOS 63 that receives the equalizing signal SE as the gate input is interposed between the output OUTi of the sense amplifier 12 and the data line Di, so as to form a control circuit that achieves the same effects as the control circuit of each of the first through fourth embodiments.

In each inventive circuit 50 of the fifth embodiment, the data line Di and the output OUTi of the sense amplifier 12 are short-circuited to each other via the NMOS 63, so that the potential VDi of the data line Di becomes equal to the reference potential Vref In the example shown in FIG. 8, the control circuit that short-circuits the data line Di and the output OUTi of the sense amplifier 12 to each other is formed with the NMOS 63. However, the short-circuiting element of the control circuit is not limited to an NMOS.

As described so far, according to the present invention, each data line Di (i=1 to m) is not short-circuited to the reference data line Dref via a switching element such as a MOSFET. Instead, the potential difference between each data line Di and the reference data line Dref is detected by the sense amplifier 12 that has the data line Di and the reference data line Dref as differential inputs. A control circuit that controls the potential VDi of the data line Di to become equal to the reference potential Vref is added to each circuit of the present invention. With this structure, each data line Di can be equalized to the reference data line Dref independently of the other data lines. Accordingly, even in a case where a problem is caused in a data line Di, the readout operation can be properly performed with the other normal data lines Di. Also, in any circuit structure according to the present invention, the reference potential generating circuit 5 can be formed with a smaller number of components than the number of sets of data to be read out. Thus, the chip size of each semiconductor device can be reduced, and a further reduction in the chip production cost can be realized.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor readout circuit that reads out a potential of each of a plurality of data lines by comparing the potential with a potential of a common reference data line, using a sense amplifier provided for each of the data lines, the semiconductor readout circuit comprising:
  a control circuit that detects a potential difference between the potential of the corresponding one of the data lines and the potential of the reference data line, and controls the potential of the corresponding data line so as to reduce the potential difference prior to a readout operation using the sense amplifier, the control circuit being provided for each of the data lines,
  wherein the control circuit includes:

a potential difference detecting circuit that detects the potential difference between the potential of the corresponding data line and the potential of the reference data line; and a current control circuit that controls an amount of current flowing between the corresponding data line and a fixed potential line for supplying a predetermined fixed potential, based on an output voltage at the corresponding potential difference detecting circuit, the fixed potential line not being the reference data line.

2. The semiconductor readout circuit according to claim 1, wherein the potential difference detecting circuit is also the sense amplifier.

3. The semiconductor readout circuit according to claim 1, wherein the potential difference detecting circuit is designed to reduce the output voltage when the potential of the corresponding data line is higher than the potential of the reference data line, the fixed potential is a ground potential, and the current control circuit includes a P-type MOSFET that receives the output of the potential difference detecting circuit as a gate input and is located between the corresponding data line and the fixed potential line.

4. The semiconductor readout circuit according to claim 1, wherein the potential difference detecting circuit is designed to increase the output voltage when the potential of the corresponding data line is higher than the potential of the reference data line, the fixed potential is a ground potential, and the current control circuit includes an N-type MOSFET that receives the output of the potential difference detecting circuit as a gate input and is located between the corresponding data line and the fixed potential line.

5. The semiconductor readout circuit according to claim 1, wherein the potential difference detecting circuit is designed to reduce the output voltage when the potential of the corresponding data line is higher than the potential of the reference data line, the fixed potential is a source potential, and the current control circuit includes an N-type MOSFET that receives the output of the potential difference detecting circuit as a gate input and is located between the corresponding data line and the fixed potential line.

6. The semiconductor readout circuit according to claim 1, wherein the potential difference detecting circuit is designed to increase the output voltage when the potential of the corresponding data line is higher than the potential of the reference data line, the fixed potential is a source potential, and the current control circuit includes a P-type MOSFET that receives the output of the potential difference detecting circuit as a gate input and is located between the corresponding data line and the fixed potential line.

* * * * *